(12) United States Patent
Scheucher et al.

(10) Patent No.: US 8,415,769 B2
(45) Date of Patent: Apr. 9, 2013

(54) INTEGRATED CIRCUITS ON A WAFER AND METHOD FOR SEPARATING INTEGRATED CIRCUITS ON A WAFER

(75) Inventors: Heimo Scheucher, Langegg (AT); Guido Albermann, Hamburg (DE); David Ceccarelli, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/668,482

(22) PCT Filed: Jul. 10, 2008

(86) PCT No.: PCT/IB2008/052779
§ 371 (c)(1),
(2), (4) Date: Jan. 11, 2010

(87) PCT Pub. No.: WO2009/007930
PCT Pub. Date: Jan. 15, 2009

(65) Prior Publication Data
US 2010/0270655 A1    Oct. 28, 2010

(30) Foreign Application Priority Data

Jul. 12, 2007   (EP) .................................... 07112355

(51) Int. Cl.
*H01L 23/544*   (2006.01)
*H01L 21/78*   (2006.01)

(52) U.S. Cl.
USPC ........................................... 257/620; 438/462

(58) Field of Classification Search ................. 257/620, 257/758, 797, E21.599
See application file for complete search history.

(56) References Cited

U.S. PATENT DOCUMENTS

| 5,668,061 A | 9/1997 | Herko et al. |
| 2005/0012228 A1 | 1/2005 | Hiramatsu et al. |

FOREIGN PATENT DOCUMENTS

| CN | 1577895 A | 2/2005 |
| CN | 1664991 A | 9/2005 |
| EP | 0921555 A | 6/1999 |
| EP | 1575086 A | 9/2005 |
| WO | 20050064679 A | 7/2005 |

*Primary Examiner* — Cuong Q Nguyen (57) ABSTRACT

Integrated circuits (1) on a wafer comprise a wafer substrate (2) and a structure applied on a surface (4) of the wafer substrate (2). The structure forms a plurality of integrated circuits (1) formed on the wafer substrate (2) and the integrated circuits (1) are separated by saw lines (6, 7). The structure comprises a plurality of superposed layers (9a-9e) formed on the wafer substrate (2) and a top layer (10) formed on the superposed layers (9a-9e). The integrated circuit (1) on the wafer further comprise a plurality of alignment marks (3) intended for aligning a separating device (18) for separating the integrated circuits (1) on the wafer into individual integrated circuits (1) during a separation process, wherein the alignment marks (3) are formed from at least one of the superposed layers (9a-9e).

17 Claims, 6 Drawing Sheets

INTEGRATED CIRCUITS ON A WAFER AND METHOD FOR SEPARATING INTEGRATED CIRCUITS ON A WAFER

FIELD OF THE INVENTION

The invention relates to integrated circuits on a wafer and to a method for separating integrated circuits on a wafer.

BACKGROUND OF THE INVENTION

Integrated circuits are usually produced by forming a plurality of integrated circuits on a semiconductor wafer substrate. The individual integrated circuits are separated by saw lines. The finished integrated circuits on the wafer are then separated into individual integrated circuits by, for instance, sawing the wafer along the saw lines or utilizing a scribe method. When separating the individual integrated circuits, a saw or a laser may be guided along the saw lines. In order to target the saw lines, the saw or laser may be aligned utilizing the pattern defined by the integrated circuits on the wafer.

The saw or laser may be guided on the top surface of the wafer, i.e. the surface of the wafer substrate on which the integrated circuits are formed, or may be guided on the bottom surface of the wafer substrate, i.e. the surface of the wafer facing away from the integrated circuits formed on the wafer. Particularly, when utilizing the bottom surface of the wafer for separating the integrated circuits, then the structure of the integrated circuits may not be detected reliably, potentially resulting in not distinguishing the saw lines from the integrated circuits and, thus, potentially missing the saw lines. This may even more pronounced if the saw lines are relatively narrow, virtually zero when utilizing laser-dicing, or almost zero when utilizing trench etching, or if the wafer comprises an epitaxial wafer substrate resulting in a milky appearance.

OBJECT AND SUMMARY OF THE INVENTION

It is an object of the present invention to provide a wafer which allows separating the integrated circuits formed thereon more reliably particularly when utilizing the bottom surface of the wafer.

The object is achieved in accordance with the invention by means of integrated circuits on a wafer comprising a wafer substrate;

a structure applied on a surface of the wafer substrate; the structure forming a plurality of integrated circuits formed on the wafer substrate and separated by saw lines, comprising a plurality of superposed layers formed on the wafer substrate, and comprising a top layer formed on the superposed layers; and a plurality of alignment marks intended for aligning a separating device for separating the integrated circuits on the wafer into individual integrated circuits during a separation step; the alignment marks being formed from at least one of the superposed layers.

The inventive integrated circuits on the wafer comprise the wafer substrate and the integrated circuits formed on the surface of the wafer substrate. The integrated circuits are formed on the wafer substrate by depositing the plurality of superposed layers on this wafer surface and by depositing the top layer on the superposed layers. The top layer may particularly be a passivation layer. A passivation layer is a sealing layer added, for instance, at the end of the fabrication process of the integrated circuits on the wafer to prevent deterioration of electronic properties through, for instance, chemical action, corrosion, or handling during a packaging process. The passivation layer may be comprised of silicon dioxide or silicon nitride, and may protect against moisture or contamination.

The integrated circuits are separated by the saw lines. When the integrated circuits have been formed on the wafer, they are to be separated during a separation step. This step is also referred to as "die separation".

During the separation step, a separating device, which may particularly comprise a laser, is guided along the saw lines. The inventive integrated circuits on the wafer, however, are particularly intended to be separated utilizing the bottom surface of the wafer substrate, i.e. the surface which is opposite to the surface on which the integrated circuits are formed. Then, the pattern of the integrated circuits separated by the saw lines may not shine through the bottom surface of the wafer substrate sufficiently, potentially hampering appropriate aligning the separating device during the separation step. This may even be more pronounced if the wafer substrate is an epitaxial wafer substrate having a milky appearance, as it may be for an embodiment of the inventive integrated circuits on the wafer.

In order to support alignment of the separating device, the inventive integrated circuits on the wafer comprise the plurality of alignment marks which are formed from at least one of the superposed layers deposited during the manufacturing of the integrated circuits on the wafer. As a result, the alignment marks are formed by an inner structure deposited on the wafer substrate, potentially allowing to be detected from the bottom surface of the wafer.

The at least one layer of the superposed layers forming the alignment marks may particularly be a metallization layer. This metallization layer may comprise TiW, Al, or Cu. The term "metallization layer" shall not only denote a pure metal, but shall also include metal alloys. The internal alignment marks made from metal allows light which shines onto the bottom surface of the wafer substrate to be reflected and thus allows automatic detection of the alignment mark. The detected alignment marks are then utilized for aligning the separating device.

The part of the metallization layer surrounding a relevant alignment mark may be comprised of scattered metallization pieces. The alignment marks may by be formed from the relevant metallization layer or layers utilizing an etching step or etching steps, respectively. The area of the relevant metallization layer around the alignment marks may be removed completely or, according to this embodiment of the inventive integrated circuits, patterned to create the scattered metallization pieces. The scattered metallization pieces may have a regular or an irregular pattern. The scattered metallization pieces are likely not to reflect or only reflect relatively poorly light shining through the bottom surface of the wafer substrate. Then, the alignment marks can be better distinguished by the separating device for the alignment procedure. The scattered metallization pieces may include active/poly pieces and full ILDs (interlayer dielectricum to metal).

The superposed layers may be comprised of a plurality of superposed metallization layers, of which at least the metallization layer located next to the wafer substrate forms the alignment marks. This reduces the amount of light to be absorbed by the wafer substrate before being reflected by the alignment marks, potentially improving automatic detection of the alignment marks.

If the superposed layers are comprised of the plurality of superposed metallization layers, then some or all of the metallization layers may form the alignment marks. The metallization layers may be relatively thin and thus only reflect a part of the light shining through the bottom surface of the wafer substrate and reaching the metallization layer. Utilizing some or even all of the metallization layers for the alignment marks increases the amount of potentially reflected light, potentially improving automatic alignment.

If the superposed layers are comprised of the plurality of superposed metallization layers, then at least two of the metallization layers, which adjoin each other immediately, may form the alignment marks. During fabrication of the inventive integrated circuits on the wafer, the superposed layers are formed on the wafer surface one after another. During two consecutive metallization layers there is usually a further layer comprised of a further material used for the integrated circuits. When forming the alignment marks, then this further layer may be removed completely at the area forming the alignment marks. Then, two consecutive metallization layers are joining each other immediately without any further material between the metallization layers at the areas corresponding to the alignment marks. Thus, according to this embodiment of the inventive integrated circuits on the wafer, the alignment marks are formed by stacks of metallization layers comprised of at least two metallization layers directly adjoining each other. In order to improve the contrast of the alignment marks, the parts of the metallization layers surrounding the alignment marks may be comprised of scattered metallization pieces and may particularly comprise the further layer which has been removed for the actual alignment marks.

The areas surrounding the actual alignment marks may be comprised of an N-well formed into the surface of the wafer substrate, a P-type layer applied on the N-well, and at least one metallization layer applied on the P-type layer. The areas surrounding the actual alignment marks may be comprised of a P-well formed into the surface of the wafer substrate, an N-type layer applied on the P-well, and at least one metallization layer applied on the N-type layer. Such a structure may relatively well absorb light shining through the bottom surface of the wafer substrate and thus improves the contrast of the alignment marks.

The alignment marks may be cross-shaped and/or may be comprised of different alignment marks each having the same shape but differ in size. The cross-shaped alignment marks may particularly have an orientation with respect to the saw lines.

In one embodiment of the inventive integrated circuits on the wafer, each alignment mark may have the form of a first cross and a second cross being smaller than the first cross.

The inventive integrated circuits on the wafer may comprise alignment modules formed from the structure, wherein the alignment modules have the same size as the integrated circuits or a size less than the integrated circuits, include the alignment marks, and are formed on the wafer substrate instead of relevant integrated circuits.

The integrated circuits may comprise contact bumps adapted to contact electric circuits of the integrated circuits and formed on or in the top layer at specific first locations. If the alignment marks are included into the alignment modules which are located on the wafer surface at certain locations instead of integrated circuits, then the alignment modules may also comprise bumps formed on or in the top layer at specific second locations, wherein the first locations of the contact bumps correspond to the second locations of the bumps of the alignment modules.

The integrated circuits on the wafer may further comprise a plurality of process control modules formed on the wafer substrate and formed from the structure. Then, the alignment marks may be integrated into the process control modules. Process control modules, usually abbreviated as PCM, are known per se in the art. Process control modules are test devices for measuring electric characteristics of the wafer. Process control modules may include active or passive electric devices, such as transistors or resistive tracks. The process control modules may particularly be located between two consecutive saw lines, for instance, instead of one or more integrated circuits. Then, the saw lines can be made relatively narrow and no space is wasted for the alignment marks. For relatively integrated the alignment marks may only be placed once or twice in the reticle inside a PCM or OCM (optical control module) area or for relatively large integrated circuits inside the integrated circuits.

The alignment marks may be integrated in at least some of the integrated circuits.

The integrated circuits may particularly be formed on the wafer utilizing a reticle. When manufacturing the integrated circuits on the wafer, an area of the wafer corresponding to the reticle is exposed and then the reticle is moved to a further area of the wafer utilizing a stepper. The area exposed by the reticle is an exposure field. Thus, the integrated circuits on the wafer may include a plurality of exposure fields. Then, each exposure field comprises some of the integrated circuits and each exposure field may comprise at least one of the alignment marks. On top of the top layer directly above the alignment marks there may gold bumps provided. The gold bumps may be used for pick/place alignment during wafer to package assembly. The gold bumps may have the same size as the alignment marks.

In a further aspect of the invention, a method for separating the inventive integrated circuits on the wafer comprises the steps of:

detecting the alignment marks integrated into the inventive integrated circuits on the wafer utilizing an alignment detecting device of a separating device and utilizing light shining through a bottom surface of the wafer substrate, wherein the bottom surface of the wafer substrate is opposite to the surface of the wafer substrate on which the integrated circuits are formed;

aligning the separating device in response to the detected alignment marks; and guiding the separating device on the bottom surface of the wafer substrate along the saw lines.

The separating device may comprise a laser which is guided along the saw lines. The laser is guided at the bottom surface along the saw lines and may alter the material of the wafer substrate while being guided along the saw lines. Then, the integrated circuits on the wafer can be separated into individual integrated circuits by, for instance, breaking the wafer running over a cylinder and flexing the integrated circuits on the wafer, which results that the wafer substrate breaks and will be expanded along the saw lines.

BRIEF DESCRIPTION OF THE DRAWINGS

The invention will be described in greater detail hereinafter, by way of non-limiting examples, with reference to the embodiments shown in the drawings.

DESCRIPTION OF EMBODIMENTS

Figure 1:
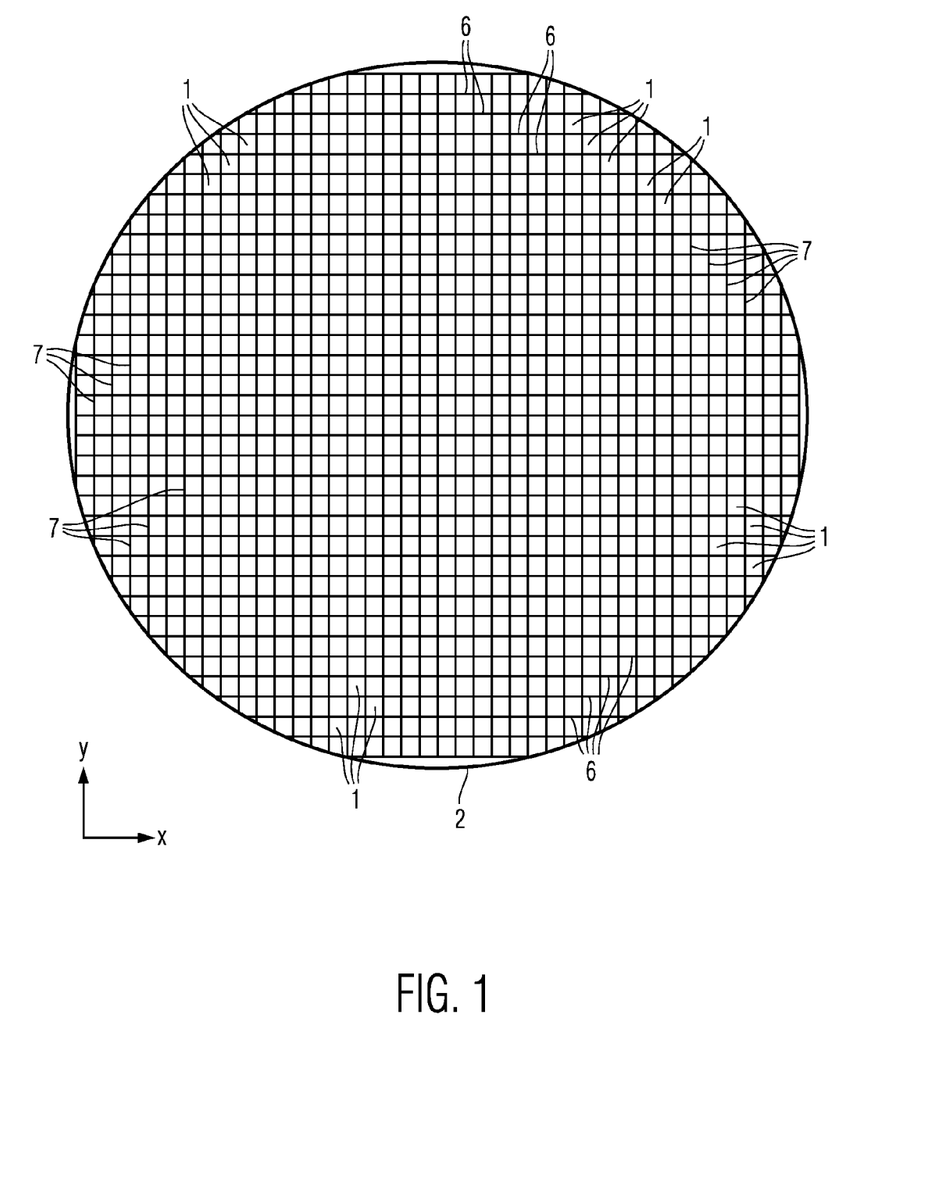
FIG. 1 is a top-view of a plurality of integrated circuits on a wafer.
Figure 2:
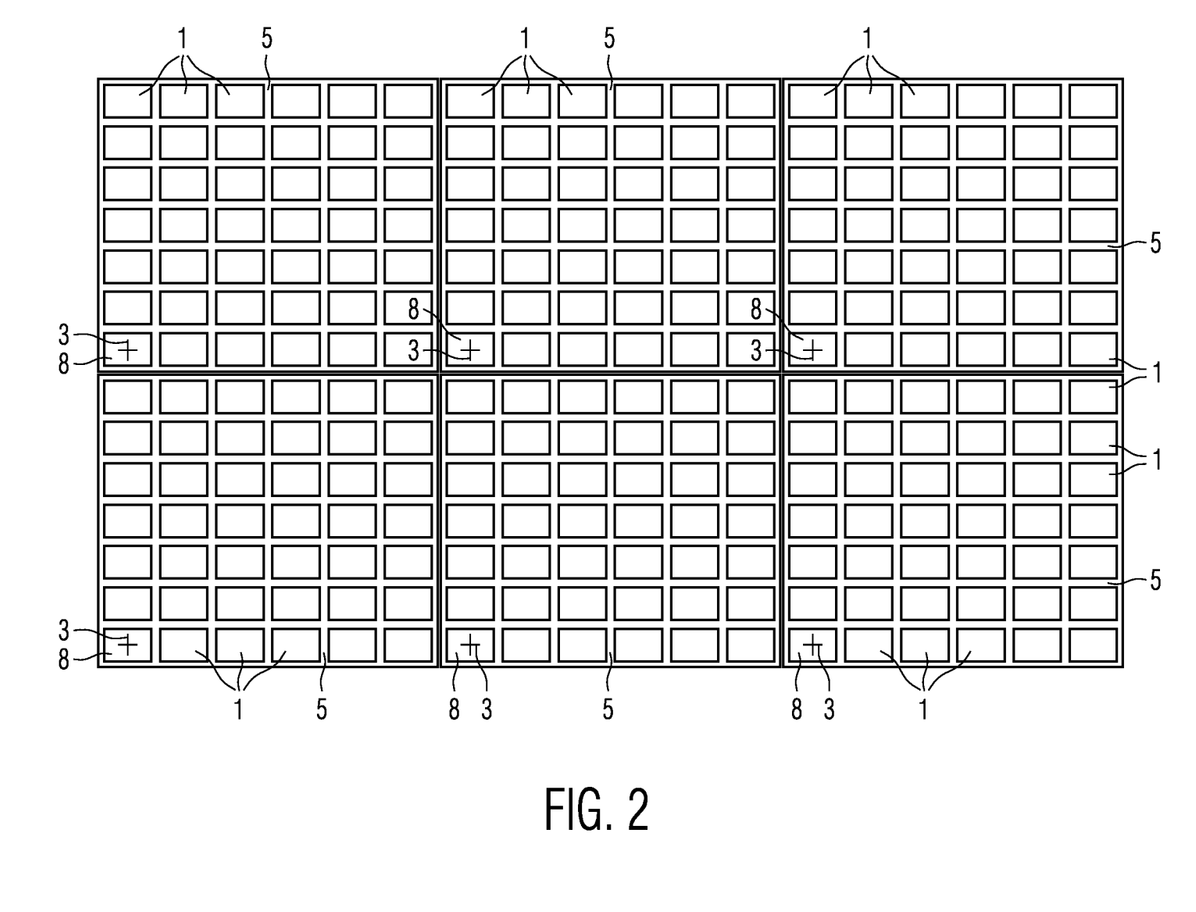
FIG. 2 is a part of the top view of the integrated circuits on the wafer.

FIG. 1 shows a top-view of a plurality of integrated circuits 1 on a semiconductor wafer and FIG. 2 shows a part of this top-view.

Figure 3:
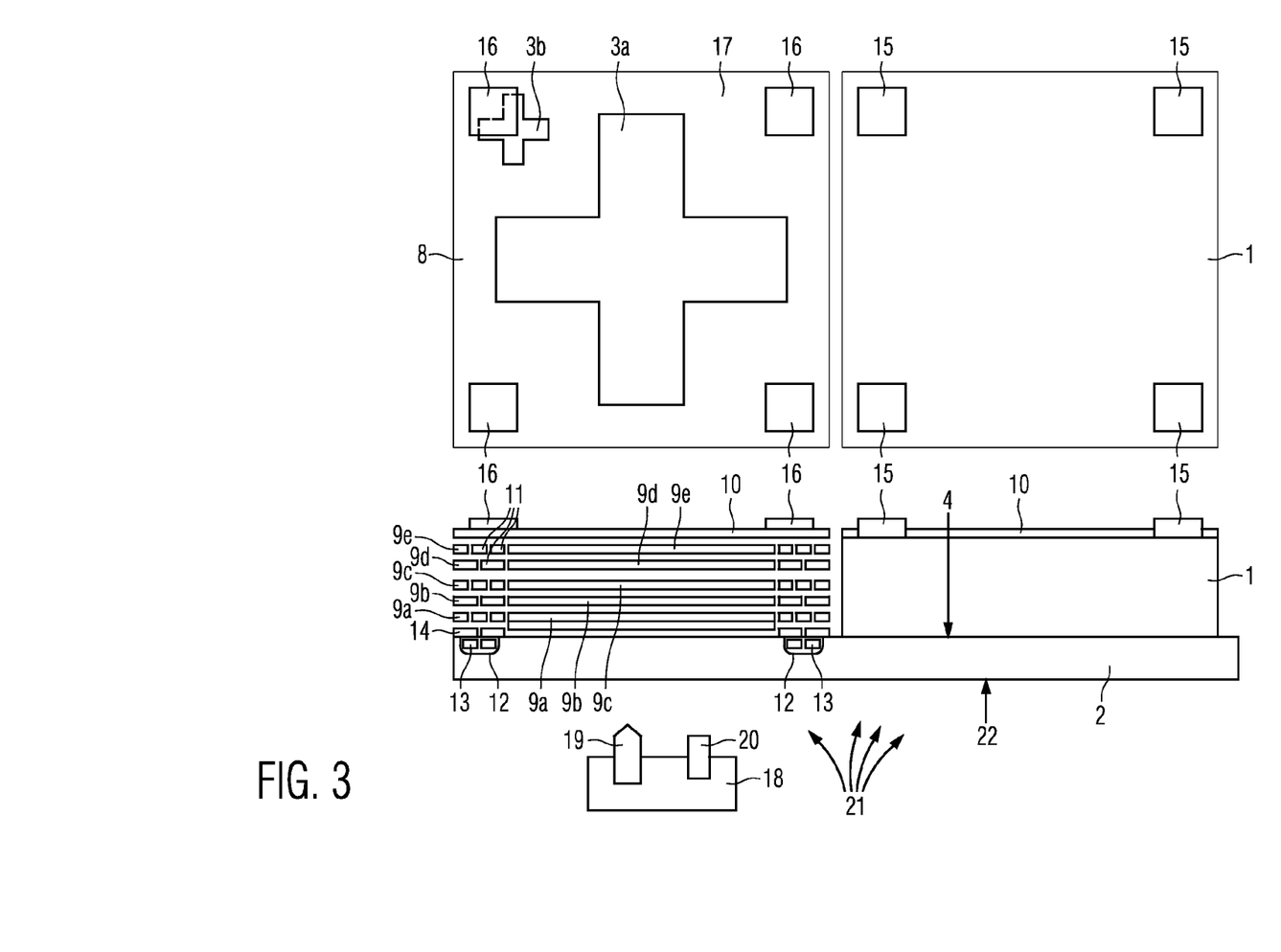
FIG. 3 is a top view and a cross section of an alignment mark of the integrated circuits on the wafer.

The integrated circuits 1 have been formed on a wafer substrate 2 as it is generally known per se in the art by forming a plurality of layers on the wafer substrate 2. For the exemplary embodiment, not only the integrated circuits 1 are formed on the wafer substrate 2, but also alignment marks 3. A top view and a cross section of one of the alignment marks 3 are shown in FIG. 3. The alignment marks 3 are utilized for aligning a separating device 18 used during a separation step during which the integrated circuits 1 on the wafer are separated into individual integrated circuits 1.

For the exemplary embodiment, the integrated circuits 1 and the alignment marks 3 have been formed on an upper wafer surface 4 of the wafer substrate 2 utilizing a reticle. When manufacturing the integrated circuits 1 on the wafer utilizing a reticle, an area of the wafer substrate 2 corresponding to the reticle is exposed and then the reticle is moved along the upper wafer surface 4 in order to expose the remaining upper wafer surface 4. An area exposed by the reticle is referred to as an exposure field 5. Thus, the upper wafer surface 4 comprises a plurality of exposure fields 5 each comprising some of the integrated circuits 1. Some of the exposure fields 5 are shown in FIG. 2. For the exemplary embodiment, each exposure field 5 comprises, in addition to the integrated circuits 1, one alignment mark 3 placed in one of the corners of the relevant exposure field 5.

The integrated circuits 1 on the wafer are separated by first saw lines 6 running parallel in a first direction x and by second saw lines 7 running parallel in a second direction y. The first and second saw lines 6, 7 are each spaced apart such that two consecutive first saw lines 6 are equidistant and two consecutive second saw lines 7 are equidistant. Therefore, the integrated circuits 1 are formed on the wafer substrate 2 in rows running in the first direction x and columns running in the second direction y. Depended on the die size of the wafer, the alignment marks 3 may be placed about every $20^{th}$ saw line 6, 7 for realignment, which may be necessary due to wafer expanding during laser process (wafer crystal structure change).

For the exemplary embodiment, not only integrated circuits 1 are formed on the upper surface 4 of the wafer substrate 2, but also alignment modules 8. The alignment modules 8 have a size not greater than the size of an integrated circuit 1 and include the alignment marks 3. Thus, each alignment module 8 is within two consecutive first saw lines 6 and within two consecutive second saw lines 7.

For the exemplary embodiment, the alignment marks 3 comprise a plurality of superposed metallization layers 9a-9e. The metallization layers 9a-9e may comprise TiW, Al, or Cu, are successively deposited on the upper wafer surface 4, and are patterned to form the alignment marks 3. In addition, the metallization layers 9a-9e are at least partly used for forming the integrated circuits 1. Moreover, as it can be seen in FIG. 3, the metallization layer 9a is a double layer when forming the alignment marks 3. The upper most metallization layer 9e forming the alignment marks 3 is coated with a passivation layer 10 which also covers the integrated circuits 1 in order to protect them, for instance, from moisture or corrosion.

For the exemplary embodiment, the metallization layers 9a-9e are patterned inter alia to form the alignment marks 3 which have the form of a first and second crosses 3a, 3b, wherein the first cross 3a is greater than the second cross 3b. Furthermore, the lines forming the crosses 3a, 3b are pointing in the first and second directions x, y. For the exemplary embodiment, the lines forming the first cross 3a are 300 µm long and 100 µm wide, and the lines forming the second cross 3b are 100 µm long and 33.33 µm wide. If the integrated circuit is larger than those mentioned above, then crosses may be designed larger as well to optimize the process according die size.

For the exemplary embodiment, each alignment module 8 comprises a single alignment mark 3 which is comprised of the first and second crosses 3a, 3b. The remaining parts 17 of each alignment module 8 surrounding the first and second crosses 3a, 3b are also comprised of the superposed metallization layers 9a-9e which have been patterned in a regular or irregular manner such that the layers surrounding the first and second crosses 3a, 3b comprise scattered metallization pieces 11. Furthermore, the remaining parts 17 of the alignment modules 8 comprises a well 12 applied in the wafer substrate 2, an active layer 13 applied in the well 12, and a layer 14 made from a polymer. The layer 14 is covered by the metallization layer 9a. The well 12 may be an N-well or a P-well. If the well 12 is an N-well, then the active layer 13 is a P-type layer. A P-type layer is made from a material in which the majorities of carriers are holes and therefore positive. If the well 12 is a P-well, then the active layer 13 is an N-type layer. An N-type layer is made from a material in which the majorities of carriers are electrons and therefore negative. N-type dopants in silicon are, for instance, Group V elements, in which the fifth outer electron is free to conduct current.

For the exemplary embodiment, the remaining parts 17 of the alignment modules 8 surrounding the alignment marks 3 border the first and second crosses 3a, 3b virtually gapless. It is also possible that there is a gap between the remaining parts 17 and the first and second crosses 3a, 3b.

For the exemplary embodiment, each integrated circuit 1 comprises contact bumps 15 which contact the electric circuits of the integrated circuits 1. The contact bumps 15 are located at the corners of the integrated circuits 1 and are applied through holes through the passivation layer 10. The alignment modules 8 do also comprise bumps 16 which are made from the same material as the contact bumps 15, have the same size as the contact bumps 15, and are applied on the passivation layer 10 at the corners of the alignment modules 8. The locations of the bumps 16 for the alignment modules 8 do thus correspond to locations of the contact bumps 15 on the integrated circuits 1. A useful material for the bumps 16 and the contact bumps 15 is metal, such as gold. Bumps on top of the crosses 3a, 3b may also be used as topside alignment markers for conventional sawing or as alignment markers for pick-place alignment marker during die assembly.

The alignment marks 3 are meant for aligning the separating device 18 during a separation step for separating the integrated circuits 1 on the wafer into individual integrated circuits 1. The separation step is summarized by a flow chart shown in FIG. 4.

Figure 4:
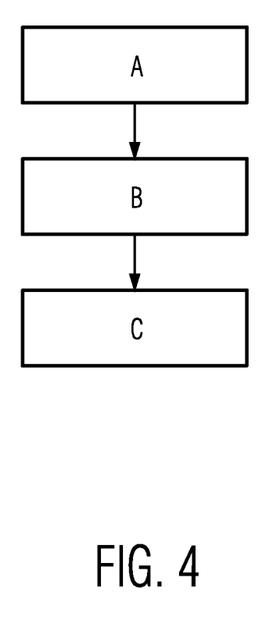
FIG. 4 is a flow chart illustrating the separation of the integrated circuits on the wafer into individual integrated circuits.

For the exemplary embodiment, the separating device 18 comprises a laser 19 which is going to be guided on a bottom wafer surface 22 of the wafer substrate 2 along the saw lines 6, 7. The bottom wafer surface 22 is opposite to the upper wafer surface 4.

In order to be guided accurately along the saw lines 6, 7, the laser 19 is aligned with respect to the wafer substrate 2. For the alignment, the bottom wafer surface 22 is subjected to light 21 which is reflected by the alignment marks 3. The reflected light is detected by an optical sensor 20 of the separating device 18, step A of the flow chart of FIG. 4. Thus, the optical sensor 20 detects the alignment marks 3.

In response to the detected alignment marks 3, the laser 19 can be aligned with respect to the wafer substrate 2, step B of the flow chart.

Then, the aligned laser 19 is guided on the bottom surface 22 along the saw lines 6, 7, step C of the flow chart. Due to the laser 19, the material of the wafer substrate 2 at the bottom wafer surface 22 is altered along the saw lines 6, 7. This enables the integrated circuits 1 on the wafer to be separated along the saw lines 6, 7 when the wafer substrate 2 is flexed.

Figure 5:
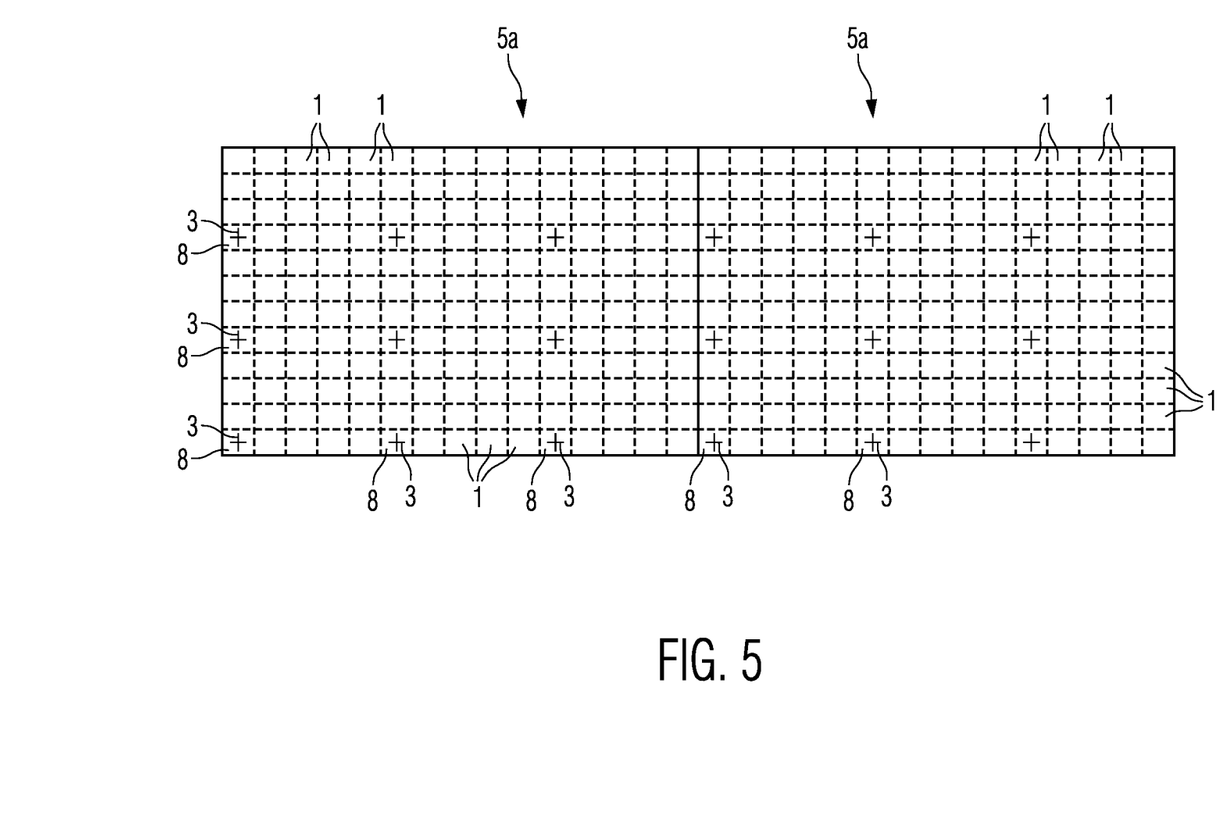
FIGS. 5 and 6 are each a part of a top surface of alternative integrated circuits on a wafer.

FIG. 5 shows a top-view of a part of alternative integrated circuits 1 on a wafer. These integrated circuits 1 on the wafer basically differ from the integrated circuits 1 on the wafer discussed above that each exposure field 5a comprises one or several alignment modules 8, each comprising an alignment mark 3. For the exemplary embodiment, the alignment modules 8 are arranged in a regular order on the wafer substrate 2.

Figure 6:
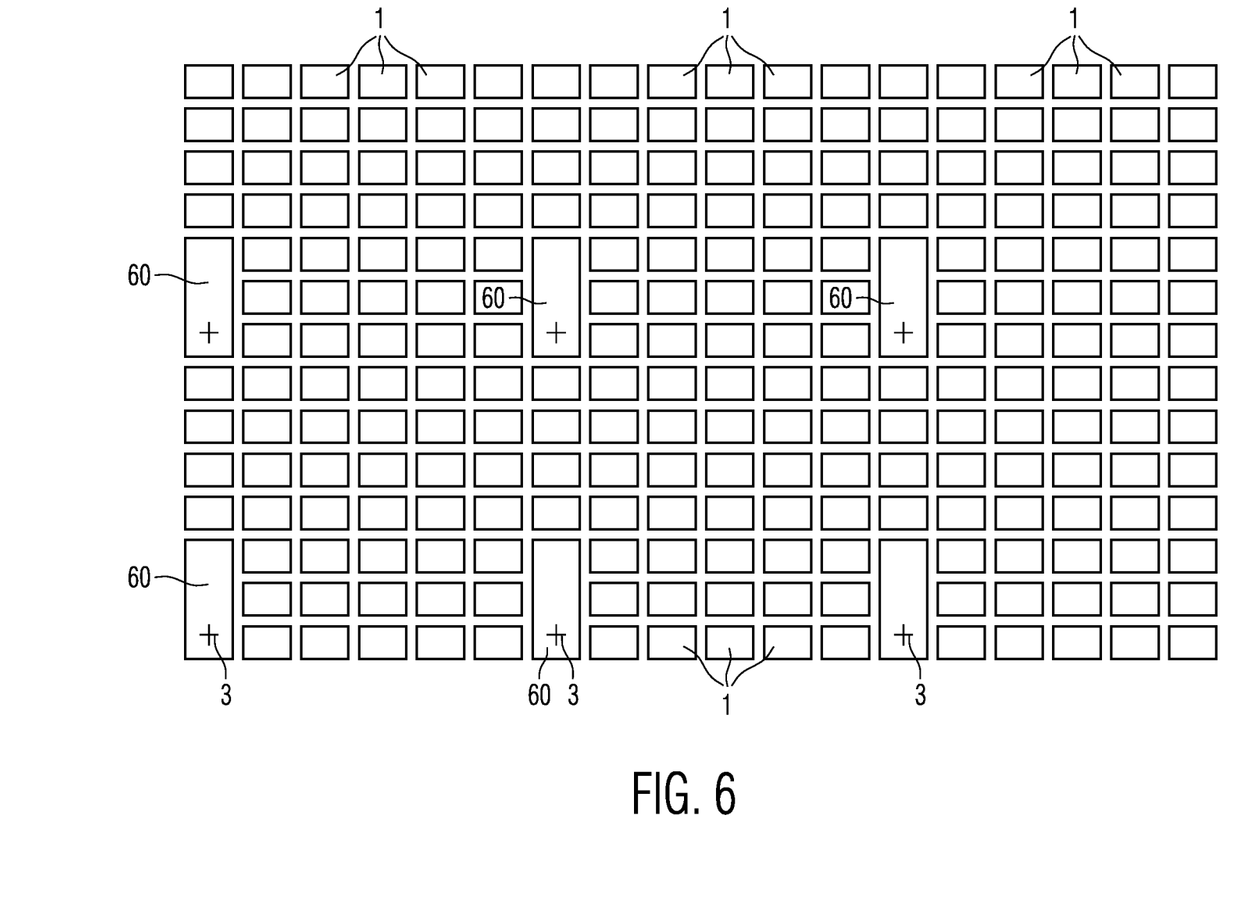

FIG. 6 depicts a further top-view of a part of alternative integrated circuits 1 on a wafer. For this embodiment, there are also process control modules 60 formed on the wafer substrate 2. Process control modules are known per se in the art and are test devices for measuring electric characteristics of the wafer. Process control modules may include active or passive electric devices, such as transistors or resistive tracks. For the exemplary embodiment, the process control modules 60 are located within a single column or row and are formed on the wafer substrate 2 instead of several of the integrated circuits 1. Furthermore, the process control modules 60 comprise the alignment marks 3. Alternatively, the alignment marks 3 can be integrated into the PCM area or in one/some of the integrated circuits 1.

Finally, it should be noted that the aforementioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. Integrated circuits on a wafer comprising:
   a wafer substrate;
   a structure applied on a surface of the wafer substrate, the structure forming a plurality of integrated circuits formed on the wafer substrate and separated by saw lines;
   a plurality of superposed layers formed on the wafer substrate;
   a plurality of metallization layers formed on the superposed layers; and
   a plurality of alignment marks configured and arranged to align a separating device for separating the integrated circuits on the wafer into individual integrated circuits during a separation step, the alignment marks being formed from the plurality of metallization layers and the plurality of integrated circuits being partially formed from the plurality of metallization layers.

2. The integrated circuits of claim 1, further including a passivation layer covering a top metallization layer of the plurality of metallization layers.

3. The integrated circuits of claim 2, wherein a portion of the metallization layer surrounding a relevant alignment mark is comprised of scattered metallization.

4. The integrated circuits of claim 1, wherein at least the metallization layer located next to the wafer substrate, some of the metallization layers, and/or at least two of the metallization layers, which adjoin each other immediately, form the alignment marks.

5. The integrated circuits of claim 1, wherein
   the alignment marks are cross-shaped;
   the alignment marks are comprised of different alignment marks each having the same shape but differ in size; and/or
   each alignment mark has the form of a first cross and a second cross being smaller than the first cross.

6. The integrated circuits of claim 1, wherein the alignment marks are integrated in at least some of the integrated circuits.

7. The integrated circuits of claim 1, further comprising a plurality of process control modules formed on the wafer substrate and formed from the structure; the alignment marks being integrated into the process control modules.

8. The integrated circuits of claim 1, further comprising alignment modules formed from the structure; the alignment modules having the same size as the integrated circuits or a size less than the integrated circuits, include the alignment marks, and are formed on the wafer substrate instead of relevant integrated circuits.

9. The integrated circuits of claim 8, wherein the integrated circuits comprise contact bumps adapted to contact electric circuits of the integrated circuits and formed on or in the top layer at specific first locations, and wherein the alignment modules comprise bumps formed on or in the top layer at specific second locations, the first locations of the contact bumps corresponding to the second locations of the bumps of the alignment modules.

10. The integrated circuits of claim 1, further comprising a plurality of exposure fields each comprising some of the integrated circuits and each comprising at least one of the alignment marks.

11. A method for separating integrated circuits on a wafer according to claim 1, comprising the steps of:
   detecting the alignment marks integrated into the integrated circuits on the wafer according to claim 1 utilizing an alignment detecting device of a separating device and utilizing light shining through a bottom surface of the wafer substrate, the bottom surface of the wafer substrate being opposite to the surface of the wafer substrate on which the integrated circuits are formed;
   aligning the separating device in response to the detected alignment marks; and
   guiding the separating device on the bottom surface of the wafer substrate along the saw lines.

12. The method of claim 11, wherein the separating device comprises a laser which is guided along the saw lines.

13. Integrated circuits on a wafer comprising:
   a wafer substrate;
   a plurality of integrated circuits on the wafer substrate and separated by saw lines;
   a plurality of superposed layers on the wafer substrate;
   a plurality of metallization layers on the superposed layers and forming a portion of the plurality of integrated circuits; and a plurality of alignment modules including at least one cross-shaped alignment mark formed from the plurality of metallization layers and configured and arranged to align a separating device for separating the integrated circuits on the wafer into individual integrated circuits during a separation step.

14. The integrated circuits of claim 13, wherein the plurality of alignment modules are of the same size as the integrated circuits.

15. The integrated circuits of claim 13, further including contact bumps configured and arranged to contact electric circuits of the integrated circuits and formed on or in the top layer at specific first locations.

16. The integrated circuits of claim 13, wherein the plurality of alignment modules include at least two cross-shaped alignment marks of different sizes.

17. The integrated circuits of claim 13, wherein the at least one cross-shaped alignment mark includes a first cross-shaped alignment mark and a second cross-shaped alignment mark, the second cross-shaped alignment mark being smaller than the first cross-shaped alignment mark.

\* \* \* \* \*